United States Patent
Okumura et al.

[11] Patent Number: 6,060,747
[45] Date of Patent: May 9, 2000

[54] SEMICONDUCTOR DEVICE

[75] Inventors: Hideki Okumura, Yokohama; Akihiko Osawa, Kawasaki; Yoshiro Baba; Noboru Matsuda, both of Yokohama; Masanobu Tsuchitani, Tokyo, all of Japan

[73] Assignee: Kabushiki Kaisha Toshiba, Kawasaki, Japan

[21] Appl. No.: 09/159,122

[22] Filed: Sep. 23, 1998

[30] Foreign Application Priority Data

Sep. 30, 1997 [JP] Japan ..................... 9-265879

[51] Int. Cl.[7] ..................................... H01L 29/78

[52] U.S. Cl. ............................. 257/331; 257/341

[58] Field of Search .................... 257/330–334, 257/341, 342; 438/270, 271, 589

[56] References Cited

U.S. PATENT DOCUMENTS

| | | | |
|---|---|---|---|
| 4,438,448 | 3/1984 | Harrington et al. | 257/331 |
| 5,072,266 | 12/1991 | Bulucea et al. | 257/341 |
| 5,410,170 | 4/1995 | Bulucea et al. | 257/331 |
| 5,864,159 | 1/1999 | Takahashi | 257/331 |
| 5,872,377 | 2/1999 | Jeon | 257/341 |

*Primary Examiner*—David Hardy
*Attorney, Agent, or Firm*—Finnegan, Henderson, Farabow, Garrett & Dunner, L.L.P.

[57] ABSTRACT

A semiconductor device is characterized in that source electrode contact regions, each of which is formed of a first conductivity type source layer and a second conductivity type base layer in a surface of a semiconductor surface, are formed at respective intersectional points of a diagonally-arranged lattice, and in that a trench having a gate electrode buried therein is formed so as to snake through the contact regions alternately. By virtue of the structure, the trench arrangement and source/base simultaneous contact quality are improved, to thereby increase a trench density (channel density) per unit area.

17 Claims, 4 Drawing Sheets

SEMICONDUCTOR DEVICE

BACKGROUND OF THE INVENTION

The present invention relates to a semiconductor device having a trench-type buried insulating gate, and more specifically, to a semiconductor device improved in trench density (the number of trenches per unit area) by improving a trench arrangement pattern and a manner of source/base simultaneous contact.

In a conventional semiconductor device serving as a switching element, a trench structure is known to be more widely employed. In the semiconductor device having a trench structure, the number of cells per unit chip area can be increased as compared to the semiconductor device having the planar structure, with the result that "on"-resistance is successfully reduced.

FIG. 1 is a plan view of a structure of a semiconductor layer of a semiconductor device having the trench structure of this type. FIG. 2 is a cross-sectional view of the semiconductor layer taken along the II—II line of FIG. 1. FIG. 2 further shows an electrode structure (omitted in FIG. 1) in addition to the sectional structure of the semiconductor layer.

In the semiconductor device, a p-type base layer 2 is formed on an n⁻-type substrate 1. In the surface of the p-type base layer 2, an n⁺-type source layer 3 of 2.6 µm width is selectively formed in stripes so as to expose the p-type base layer 2 of 1 µm between adjacent n⁺-type source layer stripes 3.

A trench 4 of 0.6 µm width is formed along a center line of the n⁺-type source layer 3. The trench 4, in the depth direction, passes through the p-type base layer and extends to the n⁻-type substrate 1. Consequently, the interval $T_0$ between adjacent trenches 4 results in 3 µm. Furthermore, a gate electrode 6 formed of polysilicon etc. is buried in each of the trenches with a gate insulating film 5 interposed therebetween.

An interlayer insulating film 7 is formed over each of the trenches 4 including a center region of each of the n⁺-type source layers 3 at both sides to the trench 4. The interlayer insulating film 7 are thus arranged in stripes. A source electrode 8 is formed so as to be in contact with the n⁺ type source layer 3 and the p-type base layer 2, which are exposed between the interlayer insulating film stripes 7.

The contact region, in which the n⁺-type source layer 3 is in contact with the p-type base layer 2, is formed between adjacent trenches. Since a sufficient alignment margin (1 µm) is set, a short circuit between the contact region and the trench gate can be prevented.

On the other hand, a drain electrode 10 is formed on a rear surface of the n⁻ type substrate 1 with an n⁺ type drain layer 9 sandwiched therebetween. The semiconductor device formed herein is a vertical MOSFET due to the n⁺ type drain layer. In the case where a semiconductor device has a p⁺ type drain layer in place of the n⁺ type drain layer 9, the semiconductor device is referred to a vertical IGBT. On the other hand, if a semiconductor has a p⁺ type drain layer and the width and depth of the trench 4, the interval between the adjacent trenches 4 and the number of the source and base contacts to that of the trenches are appropriately set so as to accumulate holes in the n⁻ type substrate 1, the semiconductor device is referred to an IEGT.

In view of reducing the "on" resistance, the channel width per unit area has been tried to be elongated, thereby improving the channel density (the number of channels per unit area). As known well, since the channel is formed in an "on"-state within the p-type base layer 2 along the side wall of the trench 4, the channel density is increased in proportion to the trench density. Therefore, to improve the channel density, it is effective to improve the trench density. The trench density can be increased by, for example, narrowing the interval $T_0$ between trenches.

However, in the aforementioned semiconductor device, it is required to set the alignment margin between the contact region and the trench gate. Since the control of the interval $T_0$ between the trenches is restricted by the alignment margin, it is difficult to narrow the trench interval $T_0$. For this reason, it is not easy to improve the trench density.

BRIEF SUMMARY OF THE INVENTION

An object of the present invention is to provide a semiconductor device improved in channel density by improving a trench arrangement pattern and a source/base simultaneous contact.

To attain the aforementioned object, a semiconductor device according to a first aspect of the present invention comprises:

a first conductivity type high-resistance layer;

a second conductivity type base layer formed on the first conductivity type high-resistance layer;

a first conductivity type source layer formed in a surface of the second conductivity type base layer, the first conductivity type source layer having a plurality of first opening portions, which are respectively formed on a plurality of points of intersection of an imaginary lattice diagonally arranged on the first conductive source layer, and through which the second conductivity type base layer is exposed;

a plurality of trenches, each selectively formed, in a depth direction, so as to pass through the first conductivity type source layer and the second conductivity type base layer and extend to the first conductivity type high-resistance layer, and each formed so as to snake through between the plurality of first opening portions either in a zigzag line or in a fish bone form, as viewed from above;

a plurality of gate electrodes each being buried in a corresponding one of the plurality of trenches with a gate insulating film interposed therebetween;

an interlayer insulating film formed on the first conductivity type source layer, the interlayer insulating film having a plurality of second opening portions, each of which has a region formed of the second conductivity type base layer exposed in each of the first openings, and a region formed of the first conductivity type source layer next to the region formed of the second conductivity type base layer;

a source electrode formed on the interlayer insulating layer, the source electrode being in contact with the regions of the second conductivity type base layer exposed in the plurality of first opening portions and regions of the first conductivity type source layer next thereto, through the second opening portions;

a drain layer formed on an opposite surface to a surface of the first conductivity type high-resistance layer having the second conductivity type base layer formed thereon; and a drain electrode formed on the drain layer.

Each of trenches formed in a zigzag line desirably has a square-pulse waveform configuration, as viewed from above.

Each of trenches formed in a zigzag line may have a trapezoidal pulse waveform configuration, as viewed from above.

Each of trenches formed in a fish bone form has a main groove linearly extending among first opening portions and a plurality of branched groove portions each being interposed between adjacent ones of the first opening portions along the main groove.

A semiconductor device according to a second aspect of the present invention, comprises:

- a first conductivity type high-resistance layer;
- a second conductivity type base layer formed on the first conductivity type high resistance layer;
- a plurality of first conductivity type source layers formed in stripes in a surface of the second conductivity type base layer, each of the plurality of first conductivity type source layers having a plurality of first opening portions which are arranged in parallel to the stripes and through which the second conductivity type base layer is exposed;
- a plurality of trenches, each being formed between adjacent two of the first conductivity type source layers, as viewed from above, and passing through the first conductivity type source layer and the second conductivity type base layer and extending to the first conductivity type high-resistance layer, in a depth direction;
- a plurality of gate electrodes each being buried in a corresponding one of the plurality of trenches with a gate insulating film interposed therebetween;
- an interlayer insulating film formed on the first conductivity type source layer and having a plurality of second opening portions, each of the plurality of second opening portions exposing the first opening portion, through which the second conductivity type base layer is exposed, and a region formed of the first conductivity type source layer surrounding the first opening portion;
- a source electrode formed on the interlayer insulating layer, the source electrode being in contact with the plurality of second conductivity type base layers and the plurality of first conductivity type source layers through the plurality of second opening portions;
- a drain layer formed on an opposite surface to a surface of the first conductivity type high-resistance layer having the second conductivity type base layer formed thereon; and
- a drain electrode formed on the drain layer
- in which the plurality of first openings which are arranged. The device according to the second aspect further has a structure in adjacent two stripes of the plurality of first conductivity type source layers, are arranged staggeringly and alternately between the adjacent two stripes of the source layers, and one of the plurality of trenches formed between the adjacent two stripes of the source layers snakes in a zigzag line through the plurality of first opening portions arranged staggeringly.

Each of trenches formed in the zigzag line desirably has a square waveform configuration, as viewed from above.

Each of trenches formed in the zigzag line may have a trapezoidal pulse waveform configuration, as viewed from above.

A distance $T_1$ between adjacent two of the trenches sandwiching one of the first opening portions is larger than a distance $T_2$ between adjacent two of the trenches not sandwiching one of the plurality of first opening portions.

A semiconductor device according to a third aspect of the present invention comprises:

- a first conductivity type high-resistance layer;
- a second conductivity type base layer formed on the first conductivity type high resistance layer;
- a plurality of the first conductivity type source layers formed in stripes in a surface of the second conductivity type base layer, each of the first conductivity type source layers having a plurality of first opening portions arranged staggeringly in two rows in parallel to the stripes so as to expose the second conductivity type base layer;
- a plurality of trenches formed between adjacent two of the plurality of first conductivity type source layers, as viewed from above, and passing through the first conductivity type source layers and the second conductivity type base layer and extending to the first conductivity type high-resistance layer, in a depth direction;
- a plurality of gate electrodes each being buried in a corresponding one of the plurality of trenches with a gate insulating film interposed therebetween;
- an interlayer insulating film formed on the first conductivity type source layer having a plurality of second opening portions, each of the plurality of second opening portions exposing a first opening portion in which the second conductivity type base layer is exposed, and a region formed of the first conductivity type source layer surrounding the first opening portion;
- a source electrode formed on the interlayer insulating layer, the source electrode being in contact with the plurality of second conductivity type base layers and the plurality of first conductivity type source layers through the plurality of second opening portions;
- a drain layer formed on an opposite surface to a surface of the first conductivity type high-resistance layer having the second conductivity type base layer formed thereon; and
- a drain electrode formed on the drain layer;
- in which one of the plurality of trenches formed between adjacent two of the source layers has a portion interposed in adjacent two of the first opening portions arranged in one of the two rows.

In the semiconductor devices according to the first and third aspects, each of the plurality of trenches is arranged substantially at a same distance from each of the plurality of first opening portions, the same distance being desirably set at a minimum accessible value of distance between each of the trenches and adjacent one of the first opening portions.

When the drain layer is formed of the first conductivity type semiconductor, a MOSFET is formed.

When the drain layer is formed of the second conductivity type semiconductor, either an IGBT or an IEGT is formed.

The gist of the present invention resides in that trenches are formed with a high density by localizing the contact regions requiring an alignment region and reducing the intervals between trenches in the region excluding the contact region, thereby increasing the trench density (channel density) as a whole.

The contact region localization pattern herein can be arbitrarily set. For example, the contact regions may be arranged in top points of an imaginary polygon or regular polygon drawn in a plane. It is preferred to employ the regular polygon since a current can be supplied uniformly. In view of increasing the channel density, a regular triangle pattern is preferable since it will provide a closest packing structure.

In the same time, the trench arrangement pattern can be arbitrarily set. For example, the trenches are arranged in a square-wave or trapezoidal waveform plane form so as to snake through between the contact regions. Alternatively, a fish-bone plane form may be employed so as to surround the contact region from three sides.

The drain layer between the first conductivity type high resistance layer and the drain electrode, may employ any conductivity type. For example, when the drain layer is formed of the first conductivity type, a MOSFET semiconductor device is obtained. On the other hand when the drain layer is formed of the second conductivity type, an IGBT semiconductor device is obtained. When the drain layer is formed of the second conductivity type and the trench width and trench interval and the number of the source and base contacts to that of the trenches are appropriately set to accumulate holes in the first conductivity type high resistance layer, an IEGT semiconductor device is obtained.

According to the present invention, by virtue of the aforementioned structure, it is possible to improve the trench arrangement pattern and the source/base simultaneous contact, resulting in the improvement in trench density (channel density).

In particular, if the distance $T_1$ which is distance between the trenches sandwiching the contact region with the source electrode is longer than the distance $T_2$ which is a distance between the trenches not sandwiching the contact region, it is easy to accumulate carriers in a region under the trench. For the reason, it is expected that the "on"-resistance may be reduced in the semiconductor devices such as IGBT and IEGT requiring carrier accumulation, thereby improving characteristics of the device.

According to the third aspect of the present invention, the trench density can also be increased as in the structure of the second aspect, it is therefore possible to improve the channel density.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, embodiments of the present invention will be explained with reference to the accompanying drawings.

(Embodiment 1)

Figure 3:
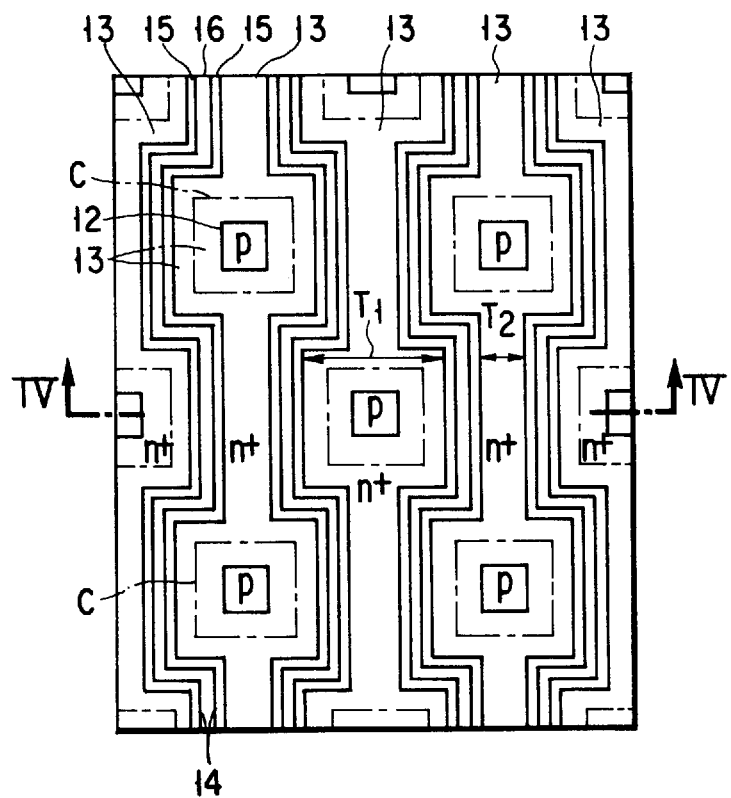
FIG. 3 is a plan view of a structure of the semiconductor layer of a semiconductor device according to Embodiment 1 of the present invention.
Figure 4:
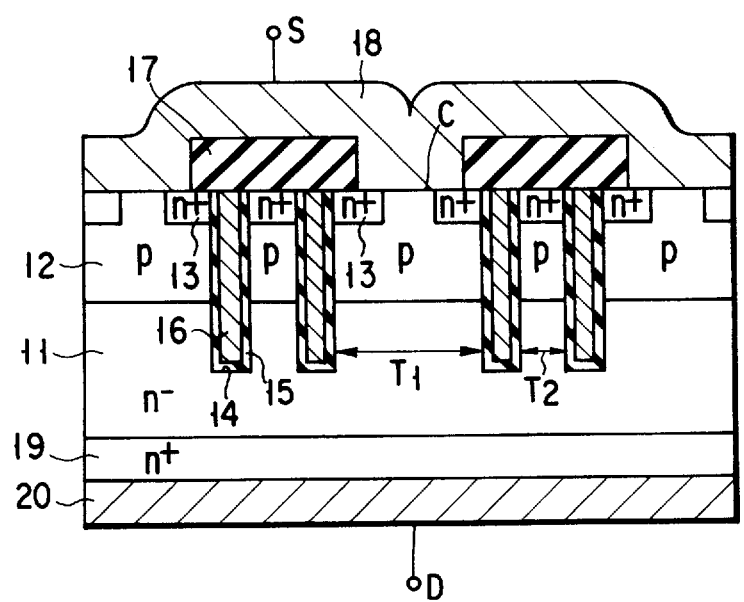
FIG. 4 is a cross-sectional view of the semiconductor layer taken along the line IV—IV of FIG. 3.

FIG. 3 is a plan view showing a structure of a semiconductor layer of a semiconductor device according to Embodiment 1 of the present invention. FIG. 4 shows a cross sectional view of the semiconductor layer taken along the line IV—IV line of FIG. 3. FIG. 4 shows an electrode structure (omitted in FIG. 3) in addition to the sectional structure of the semiconductor layer.

In the semiconductor device, a p-type base layer 12 is formed on an $n^-$ type substrate 11. In the surface of the p-type base layer 12, an $n^+$ type source layer 13 is formed. The $n^+$ type source layer 13 is formed so as to allow an island of the p-type base layer 12 to expose at each point of the intersection of a diagonally formed lattice. As a result, the islands of the exposed p-type base layer 12 are arranged in a staggered form. The $n^+$ type source layer 13 is formed, by ion implantation or solid diffusion, over the entire surface of the p-type base layer 12 excluding a plurality of contact regions of the base layer 12. The dimensions of the exposed region of the p-type base layer 12 are defined by 1 µm length×1 µm width.

In the surface of the $n^+$ type source layer 13, a plurality of trench lines 14 (square waveform plane shape) are formed. They snake through between a plurality of islands of the exposed p-type base layer 12 in a zigzag line. The trench lines 14 (0.6 µm width), in the depth direction, pass through the $n^+$ type source layer 13 and the p type base layer 12 and extend to $n^-$ type substrate 11. A gate electrode 16 made of e.g., polysilicon is buried in each of the trenches 14 with a gate insulating film 15 interposed therebetween. These gate electrodes are mutually connected through a gate wiring (not shown).

An interlayer insulating layer 17 is selectively formed on the $n^+$ type source layer 13 except on a contact region C, which is constituted of the p-type base layer 12 and the $n^+$ type source layer 13 (0.5 µm) arranged around the p-type base layer 12. An Al source electrode 18 is formed over the interlayer insulating film 17 and opening portions between the interlayer insulating film 17. As a result, the contact regions constituted of the $n^+$ type source 13 and the p-type base layer 12 (exposed in the opening of the interlayer insulating film), are in contact with the Al source electrode 18.

In this case, the contact region C, in which the $n^+$ type source layer 13 the p-type base layer 12 are exposed, is formed between the trenches 14 arranged at broader interval than others. Furthermore, since an alignment margin of 0.5 µm width is set around the $n^+$ type source layer 13, a short circuit with the trench gate is prevented.

The distance $T_1$ between the trenches 14 sandwiching the contact region C, which is in contact with the source electrode 18, is set at conventionally-employed size, 3 µm. The value of 3 µm is equal to the sum of the width of the p-type base layer 12 (1 µm), $n^+$ type source layers 13 (0.5 µm each) arranged on both sides of the p-type base layer 12, and the alignment margins (0.5 μm each) on both sides of the n+ type source layers 13. Note that, in the present invention, the distance $T_2$ between the trenches 14 not sandwiching the contact region C is set at 1 μm which is shorter than the distance $T_1$ between the trenches 14 sandwiching the contact region C therebetween ($T_2 < T_1$).

On the other hand, a drain electrode 20 is formed on the rear surface of the n⁻ type substrate 11 with the n+ type drain layer 19 interposed therebetween.

As described above, in the structure of the semiconductor device according to this embodiment, not only the contact region C with the source electrode 18 but also the region requiring the alignment margin is arranged locally. Furthermore, the interval $T_2$ between the trenches 14 formed in the region excluding the contact region C is narrowed. By virtue of the structure mentioned, the trench density of the entire device is allowed to increase.

To describe more specifically, the contact region C, each being formed of the n+ type source layer 13 and the p-type base layer 12, in contact with the source electrode 18, is positioned at points of the intersection of virtually diagonally arranged lattice. The square waveform trench 14 is formed so as to snake through between the contact regions C. In this case, the trench 14 is preferably formed so as to keep the same distance from the contact region C. The same distance is desirably set at the minimum value of possible distances between the trench and the contact region C.

According to this embodiment, the arrangement pattern of the trench 14, and the simultaneous contact between the source and base are improved, with the result that the trench density per unit area is increased. Therefore, the channel density is improved.

For example, in the semiconductor device of this embodiment, provided that the distance $T_1$ between trenches 14 sandwiching the contact region C with the source electrode 18, is set at 3 μm, and the distance $T_2$ between the trenches 14 not sandwiching the contact region C, is set at 1 μm, the channel density will be 98 m/cm². If the distance $T_2$ is set at 0.6 μm while keeping other conditions in the same as above, the channel density will be about 111 m/cm².

On the other hand, in the semiconductor device having a conventional stripe structure, if the distance $T_0$ between the trenches 4 sandwiching the contact region, is set at 3 μm, the channel density will be about 55 m/cm².

In brief, according to this embodiment, the channel density can be approximately double, compared to the conventional one.

In this embodiment, a vertical MOSFET using the n+ type drain layer 19 has been explained. However, the present invention is not limited to this. The same effects can be obtained if the present invention is applied to the IGBT or IEGT employing a p+ type drain layer in place of the n+ type drain layer 19, as described above. This can be applied to the following embodiments.

Since the distance $T_1$ is shorter than the distance $T_2$, carriers (holes) are likely to accumulate. Therefore, it is expected that the "on" resistance can be reduced in the IGBT and IEGT requiring carrier accumulation. As a result, the characteristics of the device can be improved.

In the case of the IGBT or IEGT, since the contact region C with the source electrode 18 is far away from the region not sandwiching the contact region C, the lifetime of the carriers becomes long due to the carrier confinement effect. It is therefore possible to reduce the "on" resistance.

Figure 5:
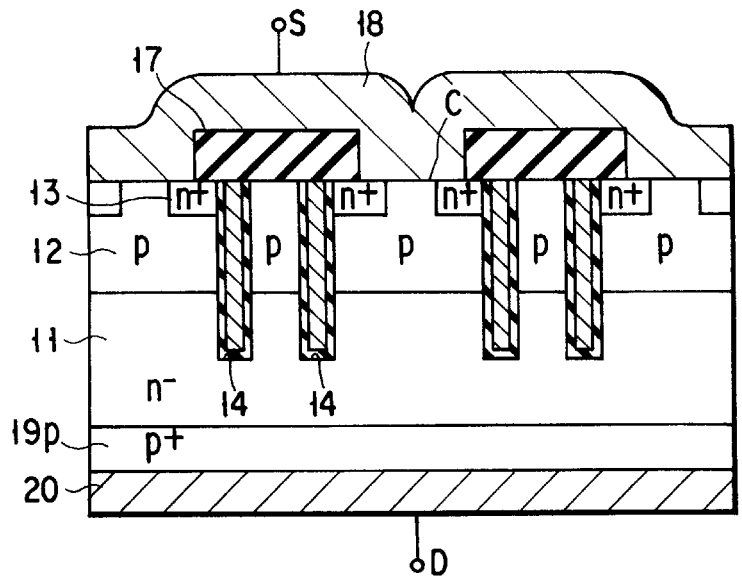
FIG. 5 is a cross sectional view of the semiconductor layer according to a modified example of Embodiment 1 and corresponds to the cross sectional view of the semiconductor layer taken along the IV—IV line of FIG. 3.

In the case of IEGT (or IGBT), the n+ type source layer 13 may be omitted from the region between the trenches 14 not sandwiching the contact region C, as shown in FIG. 5, which corresponds to the cross-sectional view of the semiconductor layer taken along the line IV—IV of FIG. 3.

(Embodiment 2)

Figure 6:
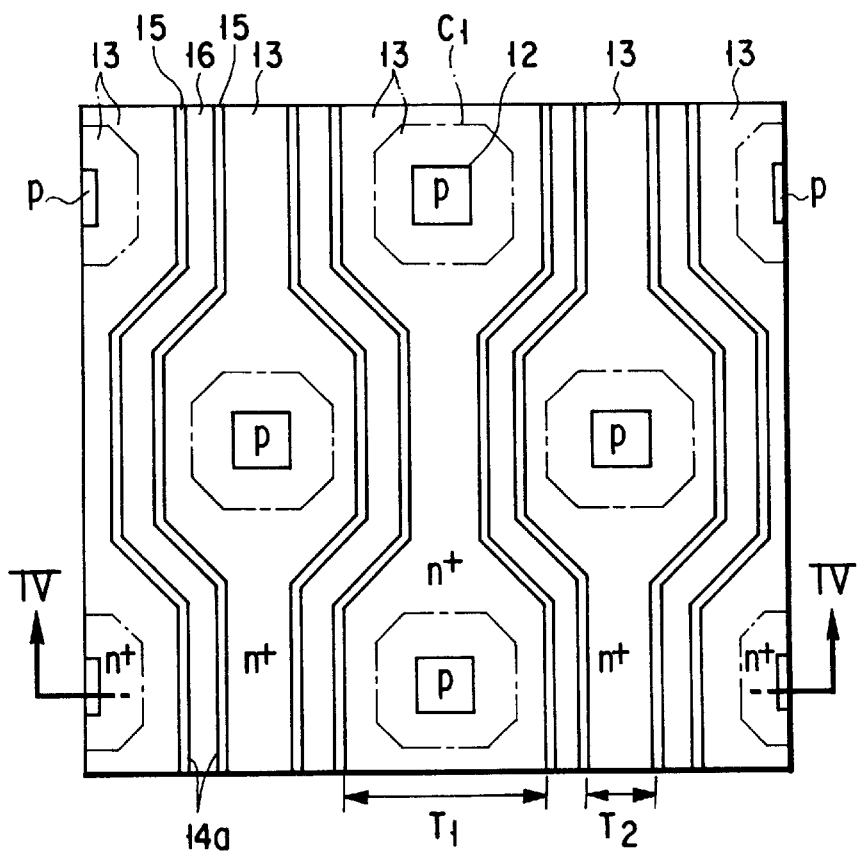
FIG. 6 is a plan view of a structure of a semiconductor layer according to Embodiment 2 of the present invention.

FIG. 6 is a plan view of a semiconductor layer of a semiconductor device according to Embodiment 2 of the present invention. In FIG. 6, the same reference numerals are used to designate like structural elements corresponding to those in FIG. 3 and detailed explanation is omitted. Only difference will be described below. Note that the same reference numerals are also used for the same elements in the following embodiments and the explanation thereof will be omitted to avoid the repetition.

Embodiment 2 is a modified example of Embodiment 1. A trench 14a has a trapezoidal-pulse waveform in place of the square waveform, as a plane shape. In addition, a contact region $C_1$ has an octagonal plane shape.

The same effects as in Embodiment 1 can be obtained even by the aforementioned structure.

(Embodiment 3)

Figure 7:
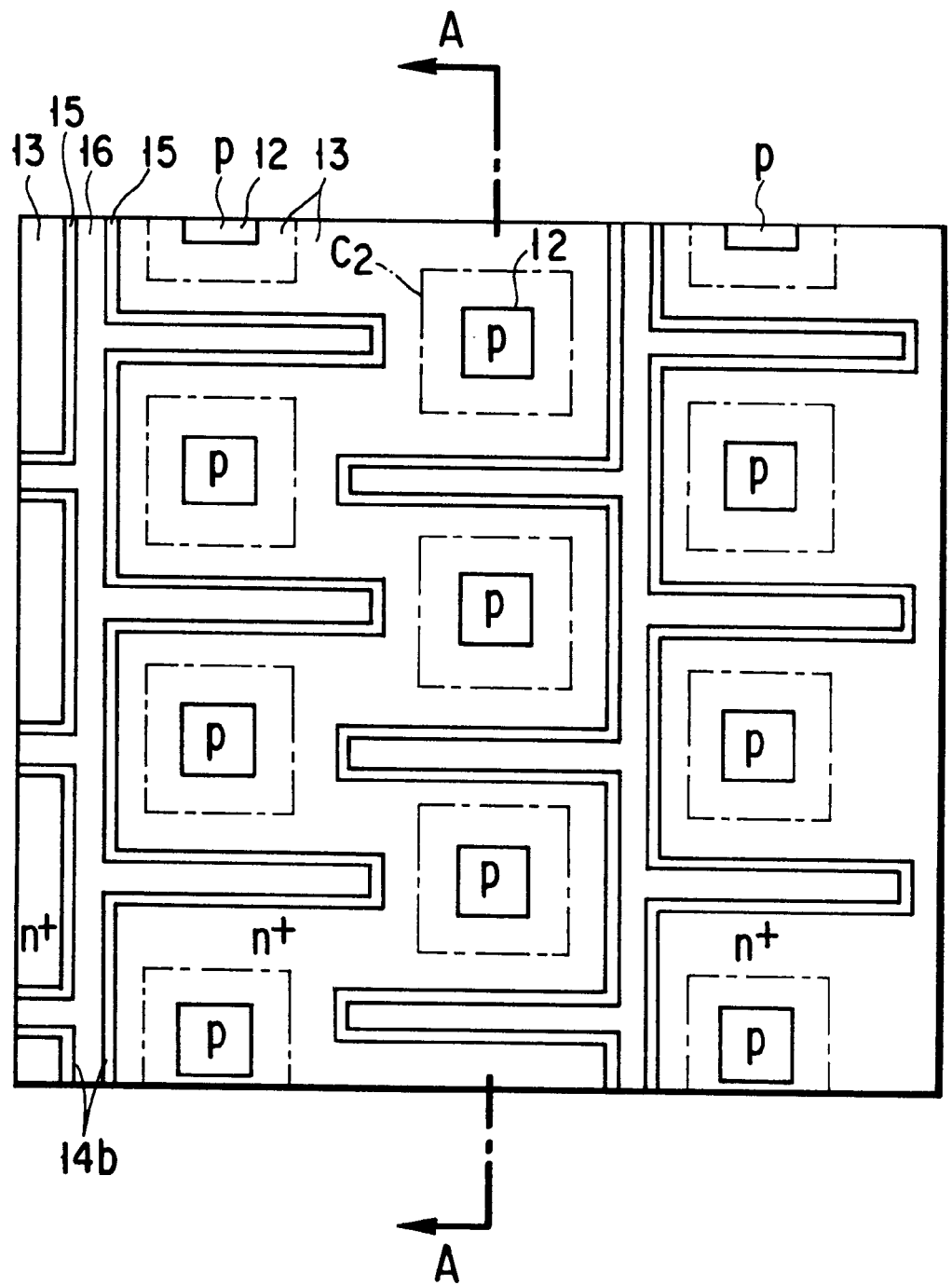
FIG. 7 is a plan view of a structure of a semiconductor layer of a semiconductor device according to Embodiment 3 of the present invention.

FIG. 7 is a plan view of a structure of a semiconductor layer of a semiconductor device according to Embodiment 3 of the present invention. Embodiment 3 is a modified example of that shown in FIG. 3.

In other words, this embodiment is a modified example of Embodiment 1. More specifically, modification is made to the localization pattern of the contact region and the plane shape of the trench.

A plurality of islands of the p-type base 12 in the contact region 12 are arranged in a staggered configuration. In other words, the islands, which are exposed from the n+ type source layer 13, are positioned at tops of continuously-drawn imaginary triangles. More specifically, the contact region $C_2$ are localized, in the form of islands, at tops of the imaginary triangles continuously and in a closest arrangement drawn in a whole plane.

Figure 1:
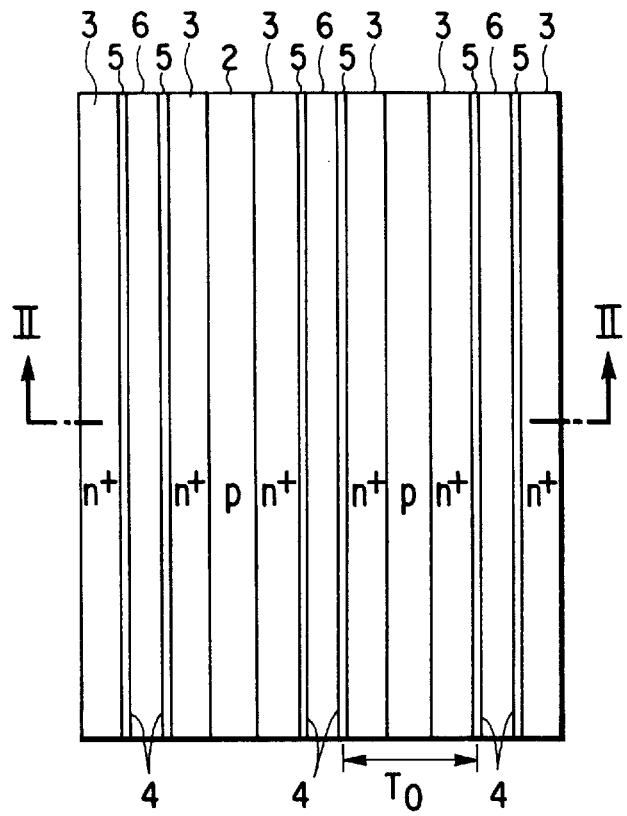
FIG. 1 is a plan view of a structure of a semiconductor layer of a semiconductor device having a conventional trench structure.
Figure 2:
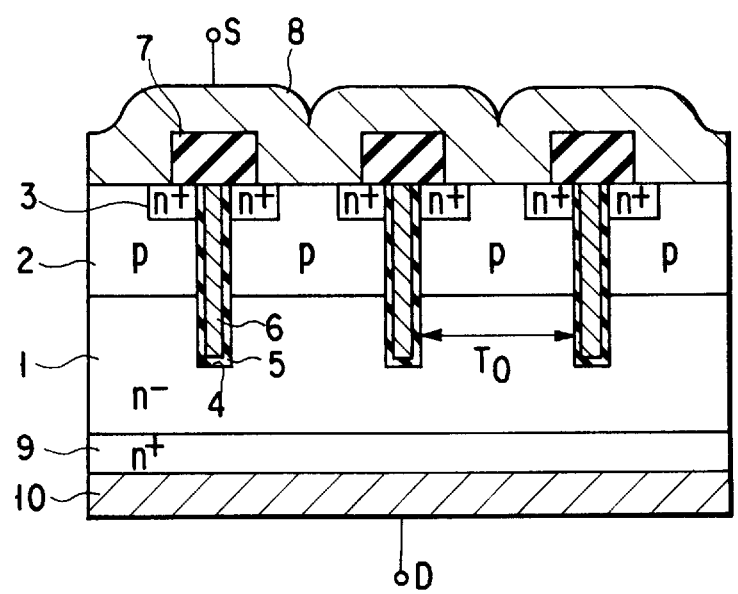
FIG. 2 is a cross-sectional view of the semiconductor layer taken along the II—II line of FIG. 1.

Trenches 14b have a fish bone (comb teeth) plane shape so as to separate adjacent contact regions $C_2$. A cross-sectional view of the semiconductor layer taken along the A—A line of FIG. 7 has the same construction as that of FIG. 2.

The plane structure of this embodiment can contribute to increasing the trench density per unit area to about 90% of that of the structures of Embodiments 1 and 2, which has contact regions localized at intersectional points of the diagonally arranged lattice and trenches snaking through the contact regions in a square waveform or trapezoidal pulse waveform. It is therefore possible to increase the channel density compared to a conventional device, in addition to the effects of Embodiments 1 and 2. Also, in this case, it is desirable, in view of increasing the trench density, that the trench 14b be arranged so as to keep the same distance from the contact region C. The same distance is desirably set at the minimum design value of the distances between the trench and the contact region In the above-described embodiments, the first conductivity type is set to "n", and the second conductivity type is set to "p", but this invention is not limited to this case, and the same effect can be attained by exchanging "n" and "p".

As explained in the foregoing, according to the present invention, it is possible to provide the semiconductor device improved in the channel density by improving the trench arrangement and the source/base simultaneous contact manner.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor device comprising:

a first conductivity type high-resistance layer;

a second conductivity type base layer formed on the first conductivity type high-resistance layer;

a first conductivity type source layer formed in a surface of the second conductivity type base layer, the first conductivity type source layer having a plurality of first opening portions, which are respectively formed on a plurality of points of intersection of an imaginary lattice diagonally arranged on the first conductivity source layer, and through which the second conductivity type base layer is exposed;

a plurality of trenches, each selectively formed, in a depth direction, so as to pass through the first conductivity type source layer and the second conductivity type base layer and extend to the first conductivity type high-resistance layer, and each formed so as to snake through between the plurality of first opening portions in one form selected from the group consisting of a zigzag line form and a fish bone form, as viewed from above;

a plurality of gate electrodes each being buried in a corresponding one of the plurality of trenches with a gate insulating film interposed therebetween;

an interlayer insulating film formed on the first conductivity type source layer, the interlayer insulating film having a plurality of second opening portions, each of which has a region formed of the second conductivity type base layer exposed in each of the first openings, and a region formed of the first conductivity type source layer next to the region formed of the second conductivity type base layer;

a source electrode formed on the interlayer insulating layer, the source electrode being in contact with the regions of the second conductivity type base layer exposed in the plurality of first opening portions and the regions of the first conductivity type source layer next thereto, through the second opening portions;

a drain layer formed on an opposite surface to a surface of said first conductivity type high-resistance layer having said second conductivity type base layer formed thereon; and a drain electrode formed on said drain layer, wherein each of the plurality of trenches is arranged substantially at a same distance from each of the plurality of first opening portions, the same distance being set at a minimum accessible value of distance between each of the trenches and adjacent one of the first opening portions.

2. The semiconductor device according to claim 1, wherein each of the plurality of trenches formed in the zigzag line has a square-pulse waveform configuration, as viewed from above.

3. The semiconductor device according to claim 1, wherein each of the plurality of trenches formed in the zigzag line has a trapezoidal pulse waveform configuration, as viewed from above.

4. The semiconductor device according to claim 1, wherein each of the plurality of trenches formed in the fish bone form has a main groove linearly extending among the plurality of first opening portions and a plurality of branched groove portions each being interposed between adjacent ones of the first opening portions along said main groove.

5. The semiconductor device according to claim 1, wherein the drain layer is formed of the first conductivity type semiconductor, thereby forming a MOSFET.

6. The semiconductor device according to claim 1, wherein the drain layer is formed of the second conductivity type semiconductor, thereby forming one of an IGBT and an IEGT.

7. A semiconductor device comprising:

a first conductivity type high-resistance layer;

a second conductivity type base layer formed on the first conductivity type high resistance layer;

a plurality of first conductivity type source layers formed in stripes in a surface of the second conductivity type base layer, each of the plurality of first conductivity type source layers having a plurality of first opening portions which are arranged in parallel to the stripes and through which the second conductivity type base layer is exposed;

a plurality of trenches, each being formed between adjacent two of the first conductivity type source layers, as viewed from above, and passing through the first conductivity type source layer and the second conductivity type base layer and extending to the first conductivity type high-resistance layer, in a depth direction;

a plurality of gate electrodes each being buried in a corresponding one of the plurality of trenches with a gate insulating film interposed therebetween;

an interlayer insulating film formed on the first conductivity type source layer and having a plurality of second opening portions, each of the plurality of second opening portions exposing the first opening portion, through which the second conductivity type base layer is exposed, and a region formed of the first conductivity type source layer surrounding the first opening portion;

a source electrode formed on the interlayer insulating layer, the source electrode being in contact with the plurality of second conductivity type base layers and the plurality of first conductivity type source layers through the plurality of second opening portions;

a drain layer formed on an opposite surface to a surface of the first conductivity type high-resistance layer having the second conductivity type base layer formed thereon; and a drain electrode formed on the drain layer, wherein the plurality of first openings which are arranged in adjacent two stripes of the plurality of first conductivity type source layers, are arranged staggeringly and alternately between the adjacent two stripes of the source layers, and one of the plurality of trenches formed between the adjacent two stripes of the source layers snakes in a zigzag line through the plurality of first opening portions arranged staggeringly.

8. The semiconductor device according to claim 7, wherein each of the plurality of trenches formed in the zigzag line, has a square waveform configuration, as viewed from above.

9. The semiconductor device according to claim 7, wherein each of the plurality of trenches formed in the zigzag line, has a trapezoidal pulse waveform configuration, as viewed from above.

10. The semiconductor device according to claim 7, wherein a distance $T_1$ between adjacent two of the trenches sandwiching one of the plurality of first opening portions is larger than a distance $T_2$ between adjacent two of the trenches not sandwiching one of the plurality of first opening portion.

11. The semiconductor device according to claim 7, wherein each of the plurality of trenches is arranged substantially at a same distance from each of the plurality of first opening portions, the same distance being set at a minimum accessible value of distance between each of the trenches and the adjacent one of the contact regions.

12. The semiconductor device according to claim 7, wherein the drain layer is formed of the first conductivity type semiconductor, thereby forming a MOSFET.

13. The semiconductor device according to claim 7, wherein the drain layer is formed of the second conductivity type semiconductor, thereby forming one of an IGBT and an IEGT.

14. A semiconductor device comprising:

a first conductivity type high-resistance layer;

a second conductivity type base layer formed on the first conductivity type high resistance layer;

a plurality of the first conductivity type source layers formed in stripes in a surface of the second conductivity type base layer, each of the first conductivity type source layers having a plurality of first opening portions arranged staggeringly in two rows in parallel to the stripes so as to expose the second conductivity type base layer;

a plurality of trenches formed between adjacent two of the plurality of first conductivity type source layers, as viewed from above, and passing through the first conductivity type source layers and the second conductivity type base layer and extending to the first conductivity type high-resistance layer, in a depth direction;

a plurality of gate electrodes each being buried in a corresponding one of the plurality of trenches with a gate insulating film interposed therebetween;

an interlayer insulating film formed on the first conductivity type source layer having a plurality of second opening portions, each of the plurality of second opening portions exposing a first opening portion in which the second conductivity type base layer is exposed, and a region formed of said first conductivity type source layer surrounding the first opening portion;

a source electrode formed on the interlayer insulating layer, the source electrode being in contact with the plurality of second conductivity type base layers and the plurality of first conductivity type source layers through the plurality of second opening portions;

a drain layer formed on an opposite surface to a surface of the first conductivity type high-resistance layer having the second conductivity type base layer formed thereon; and a drain electrode formed on the drain layer;

wherein one of the plurality of trenches formed between adjacent two of the source layers has a portion interposed in adjacent two of the first opening portions arranged in one of the two rows.

15. The semiconductor device according to claim 14, wherein each of the plurality of trenches is arranged substantially at a same distance from each of the plurality of first opening portions, the same distance being set at a minimum accessible value of distance between each of the trenches and adjacent one of the first opening portions.

16. The semiconductor device according to claim 14, wherein the drain layer is formed of the first conductivity type semiconductor, thereby forming a MOSFET.

17. The semiconductor device according to claim 14, wherein the drain layer is formed of the second conductivity type semiconductor, thereby forming one of an IGBT and an IEGT.

* * * * *

UNITED STATES PATENT AND TRADEMARK OFFICE
CERTIFICATE OF CORRECTION

PATENT NO.   : 6,060,747
DATED        : May 9, 2000
INVENTOR(S)  : Hideki Okumura et al.

It is certified that error appears in the above-identified patent and that said Letters Patent is hereby corrected as shown below:

*Title Page, Item [54], in the Title, after "DEVICE", insert --HAVING A TRENCH-TYPE BURIED INSULATING GATE--.

Claim 10, Col. 11, line 6, "portion" should read --portions--.

Signed and Sealed this

Twenty-second Day of May, 2001

*Attest:*

NICHOLAS P. GODICI

*Attesting Officer*   Acting Director of the United States Patent and Trademark Office